US006609290B1

(12) United States Patent
Takahashi

(10) Patent No.: US 6,609,290 B1
(45) Date of Patent: Aug. 26, 2003

(54) SUPERCONDUCTOR FILTER DEVICE AND MANUFACTURING METHOD THEREOF

(75) Inventor: Kuniharu Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/553,330

(22) Filed: Apr. 20, 2000

(30) Foreign Application Priority Data

Apr. 20, 1999 (JP) ........................................... 11-112551

(51) Int. Cl.[7] ................................................ H01L 39/24

(52) U.S. Cl. ........................ 29/599; 505/854; 333/99 R; 333/99 S

(58) Field of Search .......................... 29/599; 333/99 R, 333/99 S; 505/854

(56) References Cited

U.S. PATENT DOCUMENTS

| | | | |
|---|---|---|---|
| 4,996,188 A | * | 2/1991 | Kommrusch |
| 5,498,771 A | * | 3/1996 | Mansour et al. |
| 5,616,540 A | * | 4/1997 | Litgow et al. |
| 5,919,736 A | * | 7/1999 | Litgow |
| 6,433,944 B1 | | 8/2002 | Nagao et al. |

FOREIGN PATENT DOCUMENTS

| | | |
|---|---|---|
| JP | 7-254734 | 10/1995 |

* cited by examiner

*Primary Examiner*—Carl J. Arbes
(74) *Attorney, Agent, or Firm*—Sughrue Mion, PLLC

(57) ABSTRACT

A superconductor filter is stored in a hermetic filter case so that electrical connection can be provided between the superconductor filter and the outside of the hermetic filter case. The hermetic filter case is stored in a hermetic outer case so that electrical connection can be provided between the superconductor filter and the outside of the hermetic outer case and so that air/gas flow through pipes can be implemented between the inside of the hermetic filter case and the outside of the hermetic outer case. The hermetic filter case and the hermetic outer case are evacuated into vacuum, and the superconductor filter is cooled below its critical temperature. After the superconducting state of the superconductor filter could be observed, gas that does not deteriorate or react with the superconductor filter is gradually packed in the hermetic filter case and thereby the dielectric constant around the superconductor filter is raised from the dielectric constant of vacuum. The amount of the gas packed in the hermetic filter case is increased/decreased while observing transmission characteristics (center frequency etc.) of the superconductor filter, until desired transmission characteristics are obtained. Thereafter, the hermetic filter case is hermetically sealed so that the amount of the gas in the hermetic filter case will thereafter be fixed.

30 Claims, 4 Drawing Sheets

SUPERCONDUCTOR FILTER DEVICE AND MANUFACTURING METHOD THEREOF

BACKGROUND OF THE INVENTION

The present invention relates to a superconductor filter device including a superconductor filter and a manufacturing method of a superconductor filter device, and in particular, to a superconductor filter device and a manufacturing method of a superconductor filter device, by which desired transmission characteristics of the superconductor filter can be obtained without the need of a filter adjustment process by means of filter pattern processing.

DESCRIPTION OF THE PRIOR ART

Mobile radio communication devices (portable cellular phones, PHS (Personal Handy-phone System) terminals, etc.) have been showing a remarkable increase in number these days. Along with the increase, the number of mobile radio communication services or companies providing the services has also increased. Such a situation requires the frequency bandwidth for each communication link to be narrower and the frequency difference between frequency areas occupied by the services to be smaller, and a variety of measures for attaining the objects by saving the frequency resources have been proposed and studied. If the frequency difference between frequency areas of the services is made smaller, interference between adjacent frequency areas is easily caused and thereby various problems occur due to the interference. In order to resolve and eliminate the problems, a filter having both a steep (almost rectangular) attenuation property and transmission characteristics with small losses is desired and required. The superconductor filter can be regarded today as a unique filter that can satisfy the desired characteristics. However, in order to attain a desired steep attenuation property, a high precision superconductor filter has to be manufactured and a filter adjustment process has to be executed in the manufacturing process of the superconductor filter. Whether the superconductor filter shows desired transmission characteristics or not is observed and judged at a very low temperature, therefore, it is difficult to conduct filter pattern adjustment, screwing adjustment, etc. along with observing the transmission characteristics of the superconductor filter at the low temperature, differently from the case of ordinary filters.

The filter adjustment process of the superconductor filter has been executed so far by manufacturing the superconductor filter so as to have a little longer resonator pattern, cooling the superconductor filter into its superconducting state for observing the transmission characteristics, observing the transmission characteristics of the superconductor filter and checking the difference between the observed characteristics and desired characteristics, returning the superconductor filter into room temperature, processing the little longer resonator pattern of the superconductor filter by means of etching, laser beams, etc. so as to compensate the difference between the observed characteristics and desired characteristics, cooling the superconductor filter again, and observing and checking the transmission characteristics of the superconductor filter again. If the desired characteristics can not be obtained, the above filter adjustment process is repeated until the desired transmission characteristics are obtained.

The conventional manufacturing method (filter adjustment method) of a superconductor filter device which has been described above takes very long adjustment time including time for cooling the superconductor filter, time for returning the superconductor filter to room temperature, etc., and due to the accumulation of thermal stress caused by the temperature cycles, the operating life of the superconductor filter is necessitated to be shortened.

There has been proposed another manufacturing method (filter adjustment method) of a superconductor filter device in Japanese Patent Application Laid-Open No.HEI7-254734, in which the filter pattern of a superconductor filter held in its superconducting state is irradiated with a laser beam and thereby the filter pattern which has been formed a little longer is cut so as to have the desired transmission characteristics. The filter adjustment method can shorten the adjustment time and reduce the thermal stress due to the temperature cycles to minimum.

However, for executing the filter adjustment successfully, precise positioning of the filter pattern is required with respect to the irradiation point of the laser beam when the superconductor filter is installed in a vacuum chamber. If the positioning accuracy of the laser beam irradiation point is lower than a required pattern processing dimension accuracy, fine adjustment of the transmission characteristics of the superconductor filter is impossible. Further, due to the laser radiation, deterioration of the superconductive materials occurs and thereby the unloaded Q of the resonator is decreased. Consequently, transmission loss of the superconductor filter becomes larger. Furthermore, the filter adjustment by means of the laser beam is an irreversible adjustment, and thus it is impossible to regain the original transmission characteristics once the adjustment is executed excessively.

SUMMARY OF THE INVENTION

It is therefore the primary object of the present invention to provide a superconductor filter device and a manufacturing method of a superconductor filter device, by which the adjustment of the transmission characteristics of the superconductor filter can be executed easier without the need of the adjustment by means of filter pattern processing.

Another object of the present invention is to provide a superconductor filter device and a manufacturing method of a superconductor filter device, by which desired transmission characteristics can be obtained without deteriorating the properties of the superconductor filter.

In accordance with a first aspect of the present invention, there is provided a superconductor filter device comprising a superconductor filter, a hermetic filter case and gas. The superconductor filter operates as a filter in its superconducting state. The hermetic filter case stores the superconductor filter so that electrical connection can be provided between the superconductor filter and the outside of the hermetic filter case. The gas, which does not deteriorate or react with the superconductor filter, is packed in the hermetic filter case to an appropriate amount by which one or more transmission characteristics of the superconductor filter at a predetermined temperature (such as the center frequency of the superconductor) are adjusted to desired transmission characteristics.

In accordance with a second aspect of the present invention, in the first aspect, the superconductor filter device further comprises a hermetic outer case. The hermetic outer case stores the hermetic filter case and is evacuated into vacuum so that temperature control of the superconductor filter can be executed easily and correctly.

In accordance with a third aspect of the present invention, in the second aspect, the superconductor filter device further comprises pipes for implementing air/gas flow between the inside of the hermetic filter case and the outside of the hermetic outer case.

In accordance with a fourth aspect of the present invention, in the third aspect, the superconductor filter device further comprises valves for enabling/disabling the air/gas flow through the pipes.

In accordance with a fifth aspect of the present invention, in the third aspect, the pipes are provided with pipe joint means. The pipes are disconnected at the pipe joint means so that temperature control of the superconductor filter can be executed easily and correctly.

In accordance with a sixth aspect of the present invention, in the second aspect, the superconductor filter device further comprises a cooling means for cooling and controlling the temperature of the superconductor filter.

In accordance with a seventh aspect of the present invention, in the first aspect, the gas which is packed in the hermetic filter case is inert gas.

In accordance with an eighth aspect of the present invention, in the seventh aspect, the inert gas which is packed in the hermetic filter case is argon gas.

In accordance with a ninth aspect of the present invention, in the seventh aspect, the inert gas which is packed in the hermetic filter case is helium gas.

In accordance with a tenth aspect of the present invention, in the first aspect, gas whose liquefaction temperature is lower than the critical temperature of the superconductor filter is used as the gas which is packed in the hermetic filter case.

In accordance with an eleventh aspect of the present invention, in the first aspect, the superconductor filter is a microstrip line filter.

In accordance with a twelfth aspect of the present invention, in the eleventh aspect, the filter pattern of the superconductor filter is formed as a parallel-coupled-line-type microstrip line filter.

In accordance with a thirteenth aspect of the present invention, in the eleventh aspect, the filter pattern of the superconductor filter is formed as an interdigital filter.

In accordance with a fourteenth aspect of the present invention, in the eleventh aspect, the filter pattern of the superconductor filter is formed as a combline filter.

In accordance with a fifteenth aspect of the present invention, in the first aspect, the superconductor filter device is used as a highpass filter, a lowpass filter, a bandpass filter or a band elimination filter.

In accordance with a sixteenth aspect of the present invention, in the first aspect, the superconductor filter is formed of oxide superconductor materials.

In accordance with a seventeenth aspect of the present invention, in the first aspect, the electrical connection between the superconductor filter and the outside of the hermetic filter case is provided by use of hermetic RF connectors to which coaxial RF cables can be connected Ad detachably.

In accordance with an eighteenth aspect of the present invention, there is provided a manufacturing method of a superconductor filter device. The manufacturing method comprises a filter storage step and a frequency adjustment step. In the filter storage step, a superconductor filter which operates as a filter in its superconducting state is stored in a hermetic filter case so that an electrical connection can be provided between the superconductor filter and the outside of the hermetic filter case. In the frequency adjustment step, gas that does not deteriorate or react with the superconductor filter is packed in the hermetic filter case to an appropriate amount, and thereby one or more transmission characteristics of the superconductor filter at a predetermined temperature such as the center frequency are adjusted to desired transmission characteristics.

In accordance with an eighteenth aspect of the present invention, there is provided a manufacturing method of a superconductor filter device. The manufacturing method comprises a filter storage step, a case storage step, an evacuation step, a cooling step, a superconducting state judgment step, a gas packing step, a transmission characteristics adjustment step and a hermetic filter case sealing step. In the filter storage step, a superconductor filter which operates as a filter in its superconducting state is stored in a hermetic filter case so that electrical connection can be provided between the superconductor filter and the outside of the hermetic filter case. In the case storage step, the hermetic filter case storing the superconductor filter is stored in a hermetic outer case so that electrical connection can be provided between the superconductor filter and the outside of the hermetic outer case and so that air/gas flow through pipes can be implemented between the inside of the hermetic filter case and the outside of the hermetic outer case. In the evacuation step, the hermetic filter case and the hermetic outer case are evacuated into vacuum. In the cooling step, the superconductor filter is cooled below its critical temperature. In the superconducting state judgment step, it is judged whether or not the superconductor filter is showing its superconducting state. In the gas packing step, gas that does not deteriorate or react with the superconductor filter is gradually packed in the hermetic filter case and thereby the dielectric constant around the superconductor filter is raised from the dielectric constant of vacuum, after the superconducting state of the superconductor filter could be observed in the superconducting state judgment step. In the transmission characteristics adjustment step, the amount of the gas packed in the hermetic filter case is increased/decreased through the pipes while observing the change of one or more transmission characteristics of the superconductor filter due to the gas until desired transmission characteristics of the superconductor filter are obtained. In the hermetic filter case sealing step in which the increase/decrease of the gas is stopped by hermetically sealing the hermetic filter case so that the amount of the gas in the hermetic filter case will thereafter be fixed.

In accordance with a twentieth aspect of the present invention, in the nineteenth aspect, the manufacturing method of a superconductor filter device further comprises a thermal isolation step. In the thermal isolation step, the pipes for implementing the air/gas flow between the inside of the hermetic filter case and the outside of the hermetic outer case are disconnected at pipe joint sections which are provided between the hermetic filter case and the hermetic outer case and thereby the hermetic filter case is thermally isolated from outside.

In accordance with a twenty-first aspect of the present invention, in the eighteenth aspect, the gas which is packed in the hermetic filter case is inert gas.

In accordance with a twenty-second aspect of the present invention, in the twenty-first aspect, the inert gas which is packed in the hermetic filter case is argon gas.

In accordance with a twenty-third aspect of the present invention, in the twenty-first aspect, the inert gas which is packed in the hermetic filter case is helium gas.

In accordance with a twenty-fourth aspect of the present invention, in the eighteenth aspect, gas whose liquefaction temperature is lower than the critical temperature of the superconductor filter is used as the gas which is packed in the hermetic filter case.

In accordance with a twenty-fifth aspect of the present invention, in the eighteenth aspect, the superconductor filter is a microstrip line filter.

In accordance with a twenty-sixth aspect of the present invention, in the twenty-fifth aspect, the filter pattern of the superconductor filter is formed as a parallel-coupled-line-type microstrip line filter.

In accordance with a twenty-seventh aspect of the present invention, in the twenty-fifth aspect, the filter pattern of the superconductor filter is formed as an interdigital filter.

In accordance with a twenty-eighth aspect of the present invention, in the twenty-fifth aspect, the filter pattern of the superconductor filter is formed as a combline filter.

In accordance with a twenty-ninth aspect of the present invention, in the eighteenth aspect, the superconductor filter is formed as a highpass filter, a lowpass filter, a bandpass filter or a band elimination filter.

In accordance with a thirtieth aspect of the present invention, in the eighteenth aspect, the superconductor filter is formed of oxide superconductor materials.

In accordance with a thirty-first aspect of the present invention, in the eighteenth aspect, the electrical connection between the superconductor filter and the outside of the hermetic filter case is provided by use of hermetic RF connectors to which coaxial RF cables can be connected detachably.

BRIEF DESCRIPTION OF THE DRAWINGS

The objects and features of the present invention will become more apparent from the consideration of the following detailed description taken in conjunction with the accompanying drawings, in which.

DESCRIPTION OF THE PREFERRED EMBODIMENTS

Figure 1:
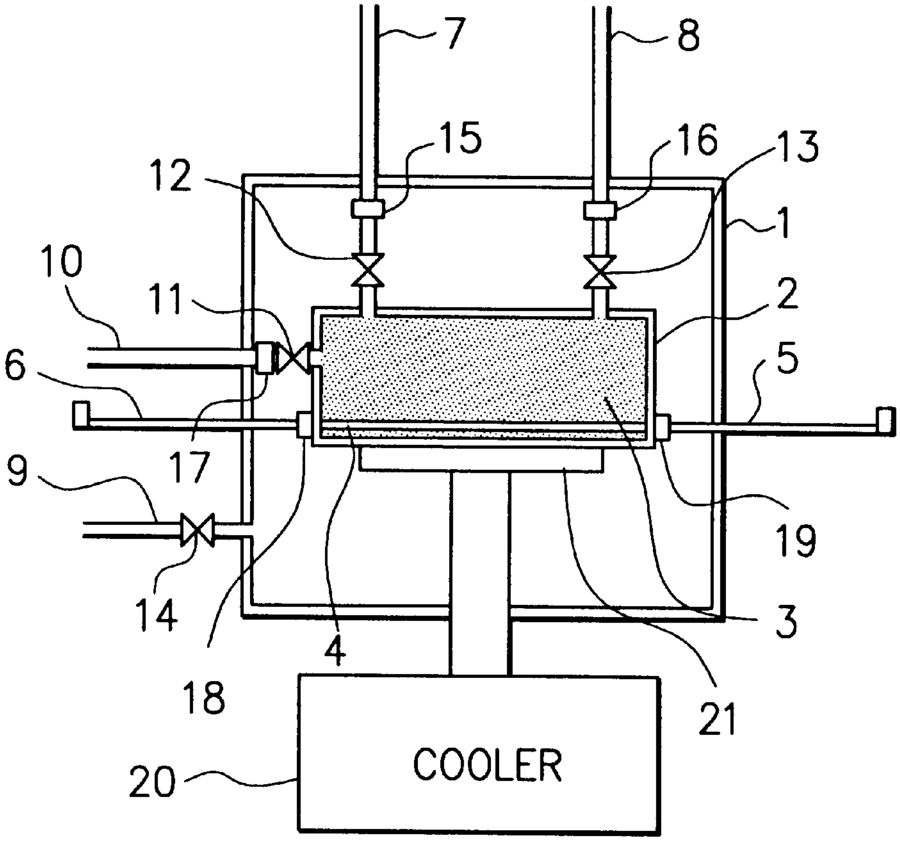
FIG.1 is a schematic cross sectional view showing the composition of a superconductor filter device in accordance with an embodiment of the present invention.

Referring now to the drawings, a description will be given in detail of preferred embodiments in accordance with the present invention.

FIG. 1 is a schematic cross sectional view showing the composition of a superconductor filter device in accordance with an embodiment of the present invention.

The superconductor filter device shown in FIG.1 includes a superconductor filter 4, a filter case 2 which stores the superconductor filter 4, a vacuum chamber 1 which stores the filter case 2, and a cooler 20 for cooling the filter case 2 and thereby cooling the superconductor filter 4. The vacuum chamber 1 and the filter case 2 are provided with vacuum evacuation pipes 9 and 10 respectively so that the air in the vacuum chamber 1 and the filter case 2 can be evacuated into vacuum. Valves 14 and 11 are provided to the vacuum evacuation pipes 9 and 10 respectively so that the air flow through the vacuum evacuation pipes 9 and 10 can be shut off.

The filter case 2 is further provided with a gas inlet pipe 7 and a gas outlet pipe 8. A gas inlet valve 12 and a gas outlet valve 13 are provided to the gas inlet pipe 7 and the gas outlet pipe 8 respectively. The concentration of gas in the filter case 2 is controlled by operating the valves 12 and 13.

The filter case 2 is also provided with hermetic RF connectors 18 and 19 to which coaxial RF cables 5 and 6 are connected detachably. The center electrode of each hermetic RF connector (18, 19) is electrically connected to the each end of the superconductor filter 4 respectively, by means of wire bonding etc. The coaxial RF cables 5 and 6 are hermetically led in the vacuum chamber 1 from outside so as to be connected to the hermetic RF connectors 18 and 19 of the filter case 2. While the coaxial RF cables 5 and 6 are directly led in the vacuum chamber 1 in the example of FIG.1, it is also possible to provide hermetic RF connectors to the vacuum chamber 1 for leading the coaxial RF cables 5 and 6 in the vacuum chamber 1.

The vacuum evacuation pipe 10, the gas inlet pipe 7 and the gas outlet pipe 8 are provided with pipe joint sections 15, 16 and 17 respectively. The pipes 10, 7 and 8 can be detached from the filter case 2 at the pipe joint sections 15, 16 and 17. By the detachment, the filter case 2 can be thermally isolated from outside and thereby temperature control of the filter case 2 and the superconductor filter 4 is made easier.

The cooler 20 having a cold head 21 cools and controls the temperature of the superconductor filter 4 by means of thermal conduction of the cold head 21.

Figure 2:
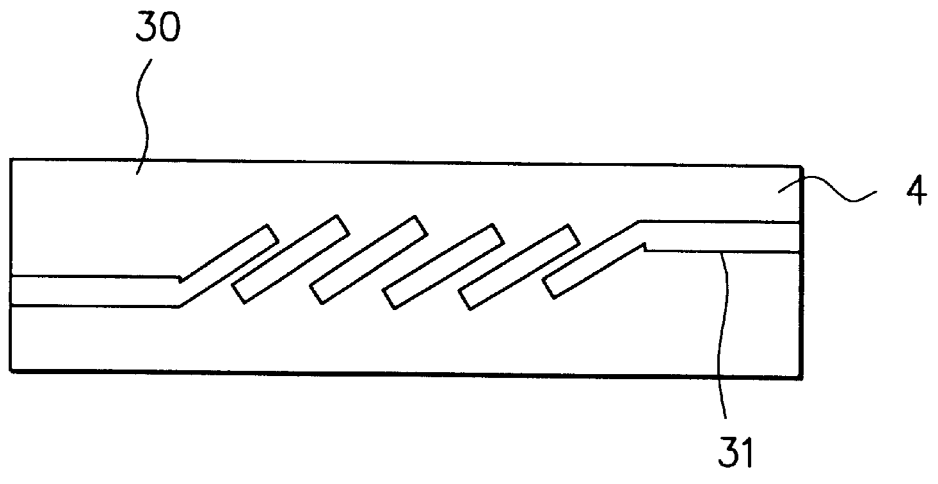
FIG.2 is a schematic plan view showing a parallel-coupled-line-type microstrip line filter as an example of a superconductor filter employed in the superconductor filter device of FIG.1.

FIG.2 is a schematic plan view showing a parallel-coupled-line-type microstrip line filter as an example of the superconductor filter 4 which is employed in the superconductor filter device of FIG.1. The parallel-coupled-line-type microstrip line filter is formed of oxide superconductor materials, for example. The filter pattern of the superconductor filter 4 that can be employed in the superconductor filter device of the present invention is not limited to the parallel-coupled-line-type microstrip line filter shown in FIG.2, but any microstrip line filter such as an interdigital filter, a combline filter, etc. can be adopted as the superconductor filter 4.

Figure 3:
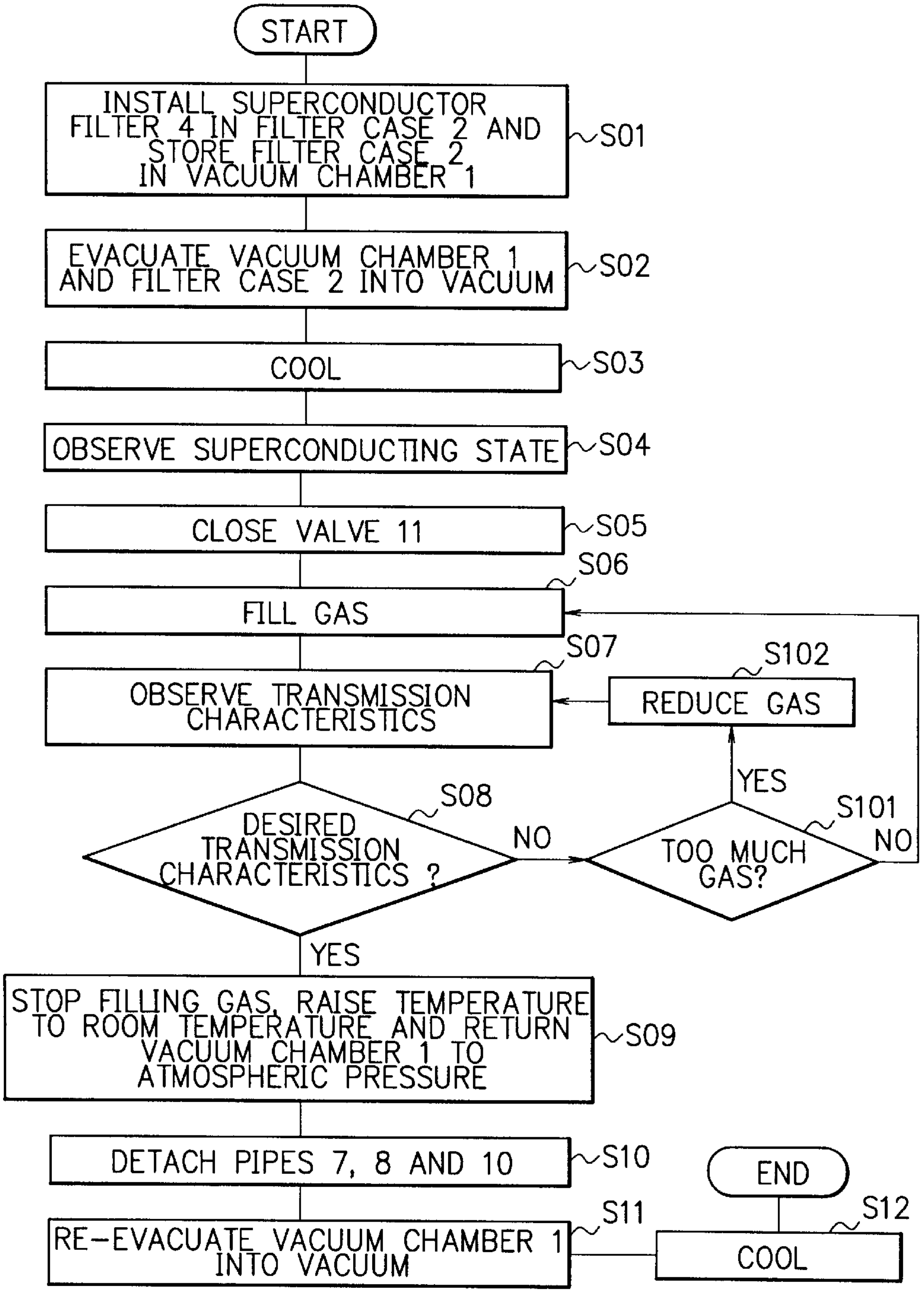
FIG.3 is a flow chart for explaining an example of a manufacturing method of the superconductor filter device of FIG. 1.

In the following, an example of a manufacturing method (filter adjustment method) of the superconductor filter device of FIG.1 will be explained in detail referring to FIG.3.

First, the superconductor filter 4 is installed in the filter case 2. The center electrode of each hermetic RF connector (18, 19) is electrically connected to the each end of the superconductor filter 4 respectively by means of wire bonding etc. Subsequently, the filter case 2 in which the superconductor filter 4 has been installed is stored in the vacuum chamber 1. The coaxial RF cables 5 and 6 are connected to a network analyzer for the observation of transmission characteristics of the superconductor filter 4. The coaxial RF cables 5 and 6 which are hermetically led in the vacuum chamber 1 are connected to the hermetic RF connectors 18 and 19 of the filter case 2. The gas inlet pipe 7 and the gas outlet pipe 8 which are also hermetically led in the vacuum chamber 1 are connected to the filter case 2 at the pipe joint sections 15 and 16. The vacuum evacuation pipe 10 which is also hermetically led in the vacuum chamber 1 is connected to the filter case 2 at the pipe joint section 17 (step S01). The gas inlet valve 12 and the gas outlet valve 13 are closed at this stage. The valves 14 and 11 are opened and thereby the vacuum chamber 1 and the filter case 2 are evacuated into vacuum (step S02). When the vacuum chamber 1 and the filter case 2 reached high vacuums, the cooler 20 is activated so that the superconductor filter 4 stored in the filter case 2 will be cooled below its critical temperature Tc (step S03). While cooling, transmission characteristics of the superconductor filter 4 is observed by the network analyzer and thereby whether the superconductor filter 4 is in a normal state or a superconducting state is checked. When the superconducting state of the superconductor filter 4 could be observed (step S04), the valve 11 of the filter case 2 is closed maintaining the superconducting state (step S05). Thereafter, the gas inlet valve 12 is opened and thereby gas 3 (helium gas, argon gas, etc.) is supplied to the filter case 2 through the gas inlet pipe 7 (step S06).

Figure 4:
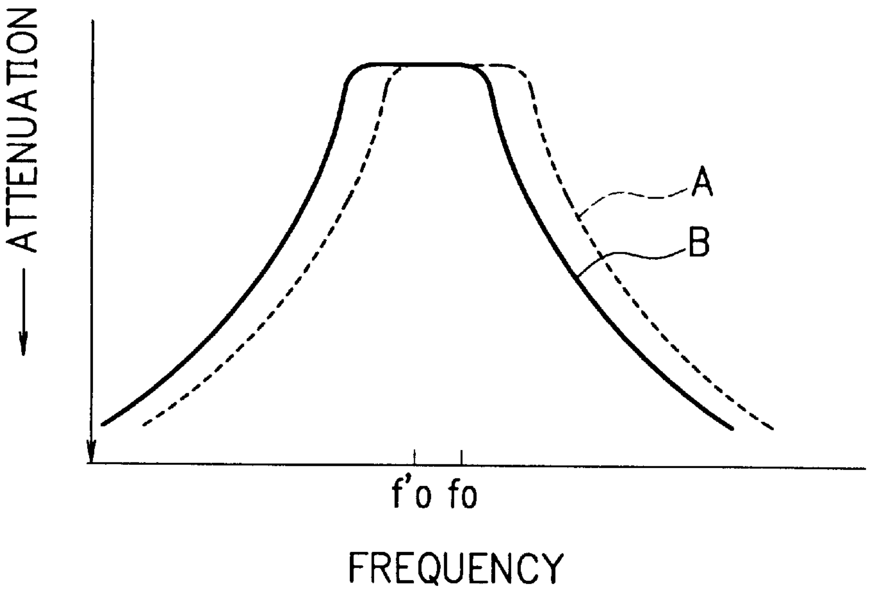
FIG.4 is a graph showing a frequency shift in the filter transmission characteristics which is realized by the superconductor filter device of the present invention.

Incidentally, while inert gases (helium gas, argon gas, etc.) are preferably used as the gas 3 for filling the filter case 2, the gas 3 used for filling the filter case 2 is not limited to inert gases, as long as the liquefaction temperature (boiling point) of the gas 3 is lower than the critical temperature Tc of the superconductor filter 4 and the gas 3 does not deteriorate or react with the superconductive material. Due to the existence of the gas 3 (having a dielectric constant larger than that of vacuum) on the microstrip lines of the superconductor filter 4, the wavelength of an electromagnetic wave (RF signal) which is supplied to the filter pattern of the superconductor filter 4 in the filter case 2 is shortened locally, thereby the wavelength of the electromagnetic wave (RF signal) which is received by an antenna and supplied to the filter pattern is required to be longer in order to pass the filter pattern of the superconductor filter 4. Consequently, a center frequency of the electromagnetic wave received by the antenna and detected by the superconductor filter 4 is lowered from f0 to f0 as shown in FIG.4. FIG.4 is a graph showing a frequency shift in the filter transmission characteristics which is realized by the superconductor filter device of the present invention, in which the horizontal axis denotes frequency of the electromagnetic wave (RF signal) and the vertical axis (downward) denotes attenuation of the RF signal. The superconductor filter 4 is designed and manufactured taking the frequency shift into consideration, therefore, the superconductor filter 4 is originally manufactured so as to have a larger center frequency than a desired RF signal frequency to be detected.

Subsequently, in the next step S07, the transmission characteristics of the superconductor filter 4 are observed by use of the network analyzer, and it is judged whether or not the superconductor filter 4 is showing desired transmission characteristics (step S08). If the superconductor filter 4 is showing desired transmission characteristics ("Yes" in the step S08), the process proceeds to step S09. If the superconductor filter 4 is not showing desired transmission characteristics ("No" in the step S08), it is judged whether or not the amount of the gas 3 is larger than an appropriate amount (that is, whether or not the observed transmission characteristics of the superconductor filter 4 is indicating that the amount of the gas 3 is larger than an appropriate amount for the desired transmission characteristics) (step S101). If the amount of the gas 3 is larger ("Yes" in the step,S101), the gas 3 in the filter case 2 is reduced by operating the gas outlet valve 13 (step S102), and the process is returned to the step S07 so as to observe the transmission characteristics of the superconductor filter 4 again. If the amount of the gas 3 is smaller ("No" in the step S101), the gas 3 is filled more into the filter case 2 (step S06) and thereafter the transmission characteristics are observed again (step S07).

If the desired transmission characteristics of the superconductor filter 4 could be obtained ("Yes" in the step S08), the process proceeds to step S09. In the step S09, the gas inlet valve 12 is closed so as to stop the supply of the gas 3, the temperature of the superconductor filter device is returned to room temperature with the desired amount of the gas 3 packed in the filter case 2, and the vacuum chamber 1 is returned to atmospheric pressure. Subsequently, the gas inlet pipe 7, the gas outlet pipe 8 and the vacuum evacuation pipe 10 are detached from the filter case 2 at the pipe joint sections 15, 16 and 17 (step S10). Thereafter, the vacuum chamber 1 is evacuated into vacuum again (step S11) and the filter case 2 is cooled so as to realize the superconducting state of the superconductor filter 4 again (step S12).

The detachment of the pipes 7, 8 and 10 from the filter case 2 in the step S10 is executed in order to thermally isolate the filter case 2 from outside and thereby make the temperature control of the superconductor filter 4 easier.

Incidentally, while the filter case 2 was not taken out of the vacuum chamber 1 in the step S10, it is also possible to take out the filter case 2 in which the desired amount of the gas 3 has already been packed. For example, the filter case 2 including the superconductor filter 4 and the desired amount of the gas 3 can also be transferred to a different place and installed in another vacuum chamber 1 there.

In the following, an example of the frequency shift of the filter transmission characteristics which is realized by the present invention will be explained in detail referring to FIG.4.

The superconductor filter 4 shown in FIG.2 is a microstrip line superconductor filter (BSCCO (Tc=100 K) etc.) for the 2GHz band which has been formed on an MgO substrate 30, for example. Argon gas, for example, is employed as the gas 3 for filling the filter case 2.

The relative dielectric constant ∈ of argon gas is:

$$\in=1+5.17\times10E\text{-}4\ (20^\circ\ \text{C.}).$$

Therefore, the wavelength of the RF signal is shortened locally due to the existence of the argon gas on the microstrip lines. Consequently, the center frequency of the RF signal detected by the superconductor filter 4 is lowered from f0 to f0 as shown in FIG.4. In this example, a center frequency shift Δf of:

$$\Delta f=f0-f'0=47\text{ kHz}$$

can be attained.

While the relative dielectric constant ∈ at 20° C. has been used, the relative dielectric constant ∈ of the argon gas becomes a little larger at a temperature between the liquefaction temperature (87.1 K) of the argon gas and the critical temperature (Tc: 100 K) of the superconductor filter 4 (90 K, for example). However, the value a remains much smaller than a relative dielectric constant 1.53 of liquid argon at 82 K.

If helium gas instead of the argon gas is used as the gas 3, the center frequency shift Δ*f* becomes smaller since the relative dielectric constant of helium gas is smaller than that of argon gas. Therefore, the superconductor filter device employing helium gas is suitable for a smaller center frequency shift Δ*f* in comparison with the superconductor filter device employing argon gas.

Incidentally, the amount (pressure) of the gas 3 packed in the filter case 2 in the filter adjustment process is not limited particularly as long as the hermeticity of the filter case 2 can be maintained. The pressure of the gas 3 packed in the filter case 2 can be varied appropriately (0.1 atm, 0.5 atm, 1 atm, 2 atm, 10 atm, etc.) for attaining the desired transmission characteristics of the superconductor filter 4 in the filter adjustment process of FIG.3. If the transmission characteristics of the superconductor filter 4 observed in the steps S7 and S8 reached the desired transmission characteristics, the amount of the gas 3 in the filter case 2 is thereafter fixed by closing the valves (step S9). If the observed transmission characteristics of the superconductor filter 4 indicates that the amount of the gas 3 is larger than an appropriate amount for the desired transmission characteristics ("Yes" in the step S101), the amount (pressure) of the gas 3 is decreased by operating the gas outlet valve 13 (step S102). If the observed transmission characteristics indicates that the amount of the gas 3 is smaller than the appropriate amount ("No" in the step S101), the amount (pressure) of the gas 3 is increased again (step S06). By such a filter adjustment process, the transmission characteristics of the superconductor filter 4 can be adjusted precisely.

As set forth hereinabove, by the superconductor filter device and the manufacturing method of a superconductor filter device in accordance with the present invention, the adjustment for obtaining desired transmission characteristics of the superconductor filter 4 can be executed at once without the need of the filter adjustment by means of filter pattern processing for once or many times. The filter adjustment according to the present invention can be conducted easily in a short adjustment time, and thus the deterioration of the operating life of the superconductor filter 4 due to the accumulation of thermal stress caused by temperature cycles can be reduced to minimum.

Further, while modification of the filter pattern becomes impossible once the adjustment is executed excessively in the case of the conventional irreversible filter adjustment by means of filter pattern processing (cutting), the filter adjustment according to the present invention is reversible adjustment not by the filter pattern processing but by use of appropriate amount of the gas 3. Therefore, any desired transmission characteristics can be realized precisely and safely without requiring the accuracy of a pattern processing devices, the positioning accuracy of the laser beam irradiation point, etc.

Furthermore, deterioration of superconductive materials of the superconductor filter 4 due to the laser radiation etc. does not occur in the filter adjustment according to the present invention. Therefore, deterioration of the properties of the superconductor filter 4 (such as the increase of transmission loss of the superconductor filter 4) due to the filter adjustment can be eliminated.

Therefore, the superconductor filter device and the manufacturing method of a superconductor filter device in accordance with the present invention are more advantageous than the prior art from the viewpoint of performance, time, cost, etc.

While the present invention has been described with reference to the particular illustrative embodiments, it is not to be restricted by those embodiments but only by the appended claims. For example, while the superconductor filter 4 of the superconductor filter device which has been explained above was used as a bandpass filter, the present invention can also be applied to cases where the superconductor filter 4 is employed as a highpass filter, a lowpass filter, a band elimination filter, etc. In the cases where the superconductor filter 4 is employed as a highpass filter or a lowpass filter, a cut-off frequency instead of the center frequency is adjusted as the "transmission characteristics" in the filter adjustment process. The number of the "transmission characteristics" to be adjusted in the filter adjustment process is not limited to one, and two or more transmission characteristics can also be adjusted according to the present invention. It is to be appreciated that those skilled in the art can change or modify the embodiments without departing from the scope and spirit of the present invention.

What is claimed is:

1. A manufacturing method of a superconductor filter device comprising:

a superconductor filter which operates as a filter in its superconducting state is stored in a hermetic filter case so that electrical connection can be provided between the superconductor filter and the outside of the hermetic filter case; and gas that does not deteriorate or react with the superconductor filter is packed in the hermetic filter case to an appropriate amount, and thereby one or more transmission characteristics of the superconductor filter at a predetermined temperature such as the center frequency are adjusted to desired transmission characteristics, wherein the filter pattern of the superconductor filter is formed as a parallel-coupled-line-type microstrip line filter.

2. A manufacturing method of a superconductor filter device as claimed in claim 1, wherein the gas which is packed in the hermetic filter case is inert gas.

3. A manufacturing method of a superconductor filter device as claimed in claim 2, wherein the inert gas which is packed in the hermetic filter case is argon gas.

4. A manufacturing method of a superconductor filter device as claimed in claim 2, wherein the inert gas which is packed in the hermetic filter case is helium gas.

5. A manufacturing method of a superconductor filter device as claimed in claim 1, wherein gas whose liquefaction temperature is lower than the critical temperature of the superconductor filter is used as the gas which is packed in the hermetic filter case.

6. A manufacturing method of a superconductor filter device as claimed in claim 1, wherein the superconductor filter is formed of oxide superconductor materials.

7. A manufacturing method of a superconductor filter device as claimed in claim 1, wherein the electrical connection between the superconductor filter and the outside of the hermetic filter case is provided by use of hermetic RF connectors to which coaxial RF cables can be connected detachably.

8. A manufacturing method of a superconductor filter device comprising:

a superconductor filter which operates as a filter in its superconducting state is stored in a hermetic filter case so that electrical connection can be provided between the superconductor filter and the outside of the hermetic filter case; and gas that does not deteriorate or react with the superconductor filter is packed in the hermetic filter case to an appropriate amount, and thereby one or more transmission characteristics of the superconductor filter at a predetermined temperature such as the center frequency are adjusted to desired transmission characteristics, wherein the filter pattern of the superconductor filter is formed as an interdigital filter.

9. The manufacturing method of a superconductor filter device as claimed in claims 8, wherein the gas which is packed in the hermetic filter is inert gas.

10. The manufacturing method of a superconductor filter device as claimed in claim 8, wherein the inert gas which is packed in the hermetic filter case is argon gas.

11. The manufacturing method of a superconductor filter device as claimed in claim 8, wherein the gas which is packed in the hermetic filter is helium gas.

12. The manufacturing method of a superconductor filter device as claimed in claim 8, wherein gas whose liquefaction temperature is lower than the critical temperature of the superconductor filter is used as the gas which is packed in the hermetic filter case.

13. The manufacturing method of a superconductor filter device as claimed in claim 8, wherein the superconductor filter is formed of oxide superconductor materials.

14. The manufacturing method of a superconductor filter device as claimed in claim 8, wherein the electrical connection between the superconductor filter and the outside of the hermetic filter case is provided by use of hermetic RF connectors to which coaxial RF cables can be connected detachably.

15. A manufacturing method of a superconductor filter device comprising:

a superconductor filter which operates as a filter in its superconducting state is stored in a hermetic filter case so that electrical connection can be provided between the superconductor filter and the outside of the hermetic filter case; and gas that does not deteriorate or react with the superconductor filter is packed in the hermetic filter case to an appropriate amount, and thereby one or more transmission characteristics of the superconductor filter at a predetermined temperature such as the center frequency are adjusted to desired transmission characteristics, wherein the filter pattern of the superconductor filter is formed as a combline filter.

16. The manufacturing method of a superconductor filter device as claimed in claim 15, wherein the gas which is packed in the hermetic filter is inert gas.

17. The manufacturing method of a superconductor filter device as claimed in claim 15, wherein the inert gas which is packed in the hermetic filter case is argon gas.

18. The manufacturing method of a superconductor filter device as claimed in claim 15, wherein the gas which is packed in the hermetic filter is helium gas.

19. The manufacturing method of a superconductor filter device as claimed in claim 15, wherein gas whose liquefaction temperature is lower than the critical temperature of the superconductor filter is used as the gas which is packed in the hermetic filter case.

20. The manufacturing method of a superconductor filter device as claimed in, claim 15, wherein the superconductor filter is formed of oxide superconductor materials.

21. The manufacturing method of a superconductor filter device as claimed in claim 22, wherein the electrical connection between the superconductor filter and the outside of the hermetic filter case is provided by use of hermetic RF connectors to which coaxial RF cables can be connected detachably.

22. A manufacturing method of a superconductor filter device comprising:

a superconductor which operates as a filter in its superconducting state is stored in a hermetic filter case so that electrical connection can be provided between the superconductor filter and the outside of the hermetic filter case; and gas that does not deteriorate or react with the superconductor filter is packed in the hermetic filter case to an appropriate amount, and thereby one or more transmission characteristics of the superconductor filter at a predetermined temperature such as the center frequency are adjusted to desired transmission characteristics, wherein the superconductor filter is formed as a highpass filter, a lowpass filter, a bandpass filter or a band elimination filter.

23. The manufacturing method of a superconductor filter device as claimed in claim 22, wherein the gas which is packed in the hermetic filter is inert gas.

24. The manufacturing method of a superconductor filter device as claimed in claim 22, wherein the inert gas which is packed in the hermetic filter case is argon gas.

25. The manufacturing method of a superconductor filter device as claimed in claims 22, wherein the gas which is packed in the hermetic filter is helium gas.

26. The manufacturing method of a superconductor filter device as claimed in claim 22, wherein gas whose liquefaction temperature is lower than the critical temperature of the superconductor filter is used as the gas which is packed in the hermetic filter case.

27. The manufacturing method of a superconductor filter device as claimed in claim 22, wherein the superconductor filter is formed of oxide superconductor materials.

28. The manufacturing method of a superconductor filter device as claimed in claim 22, wherein the electrical connection between the superconductor filter and the outside of the hermetic filter case is provided by use of hermetic RF connectors to which coaxial RF cables can be connected detachably.

29. A manufacturing method of a superconductor filter device comprising:

a superconductor filter which operates as a filter in its superconducting state is stored in a hermetic filter case so that electrical connection can be provided between the superconductor filter and the outside of the hermetic filter case;

the hermetic filter case storing the superconductor filter is stored in a hermetic outer case so that electrical connection can be provided between the superconductor filter and the outside of the hermetic outer case and so that air/gas flow through pipes can be implemented between the inside of the hermetic filter case and the outside of the hermetic outer case;

the hermetic filter case and the hermetic outer case are evacuated into vacuum;

the superconductor filter is cooled below its critical temperature;

judged whether or not the superconductor filter is showing its superconducting state;

gas that does not deteriorate or react with the superconductor filter is gradually packed in the hermetic filter case and thereby the dielectric constant around the superconductor filter is raised from the dielectric constant of vacuum, after the superconducting state of the superconductor filter could be observed;

the amount of the gas packed in the hermetic filter case is increased/decreased through the pipes while observing the change of one or more transmission characteristics of the superconductor filter are obtained; and the increase/decrease of the gas is stopped by hermetically seating the hermetic filter case so that the amount of the gas in the hermetic filter case will thereafter be fixed.

30. A manufacturing method of a superconductor filter device as claimed in claim 29, further comprising:

the pipes for implementing the air/gas flow between the inside of the hermetic filter and the outside of the hermetic outer case are disconnected at pipe joint sections which are provided between the hermetic filter case and the hermetic outer case and thereby the hermetic filter case is thermally isolated from outside.

* * * * *